United States Patent [19]

Schmalbein et al.

[11] Patent Number: 4,782,296

[45] Date of Patent: Nov. 1, 1988

[54] ELECTRON SPIN RESONANCE SPECTROMETER

[75] Inventors: Klaus-Dieter Schmalbein, Marxzell-Burbach; Kàroly Holczer, Karlsruhe, both of Fed. Rep. of Germany

[73] Assignee: Bruker Analytische Mebtechnik GmbH Silberstetten-, Rheinstetten-Forchheim, Fed. Rep. of Germany

[21] Appl. No.: 123,590

[22] Filed: Nov. 20, 1987

[30] Foreign Application Priority Data

Aug. 6, 1987 [DE] Fed. Rep. of Germany ....... 3726045

[51] Int. Cl.$^4$ .......................................... G01R 33/20
[52] U.S. Cl. ..................... 324/316; 324/322
[58] Field of Search ............. 324/300, 307, 309, 316, 324/317, 318, 322, 58.5 R, 58.5 A, 58.5 B, 58.5 C; 128/653; 333/219

[56] References Cited

U.S. PATENT DOCUMENTS

| | | | |
|---|---|---|---|
| 3,879,653 | 4/1975 | Hyde et al. | 324/316 |
| 3,931,569 | 1/1976 | Hyde | 324/316 |
| 4,259,638 | 3/1981 | Krueger | 324/318 |
| 4,593,248 | 6/1986 | Hyde | 324/317 |
| 4,623,835 | 11/1986 | Mehdizadeh | 324/316 |
| 4,712,560 | 12/1987 | Schaefer | 128/653 |

OTHER PUBLICATIONS

Phys. Rev. Letter 54, p. 1241 (1985) by Schweiger.

*Primary Examiner*—Michael J. Tokar
*Attorney, Agent, or Firm*—Rosenblum, Parish & Bacigalupi

[57] ABSTRACT

An electron spin resonance spectrometer comprises a resonator arranged in a magnetic field of constant strength and high homogeneity and containing a sample. The resonator can be supplied, via a microwave bridge, with microwave energy in the form of a continuous-wave signal (CW) or in the form of an intermittent signal (P). Measuring signals emitted by the resonator can be supplied to a detector arrangement and a signal evaluation arrangement. In order to be able to carry out individual experiments with continuous-wave signals or intermittent signals of low power or with intermittent signals of high power in arbitrary combination and with an arbitrary succession of microwave pulses, the spectrometer comprises a first channel for supplying a continuous-wave signal or an intermittent signal of small power in the mW range and a second channel for supplying an intermittent signal of high power in the W range. The channels are connected by their inputs to a common microwave source and united at their outputs. So the said channels can be selectively operated either individually or jointly.

5 Claims, 7 Drawing Sheets

ELECTRON SPIN RESONANCE SPECTROMETER

The present invention relates to an electron spin resonance spectrometer comprising a resonator arranged in a magnetic field of constant strength and high homogeneity and containing a sample, in which the resonator can be supplied, via a microwave bridge, with microwave energy in the form of a continuous-wave signal or in the form of an intermittent signal and in which measuring signals emitted by the resonator are supplied to a detector arrangement and a signal evaluation arrangement. An electron spin resonance spectrometer of the type described above has been known from the paper by Schweiger, published in US Z Phys. Rev. Lett. 54, page 1241 (1985).

The known electron spin resonance (ESR) spectrometer uses a single-channel arrangement which can be operated alternatively in the continuous-wave (CW) mode or in the intermittent mode (so-called pulse operation). The microwave channel comprises a power amplifier with a travelling-wave tube for generating the high microwave peak powers necessary for ESR pulse experiments. However, this single-channel design is connected with two disadvantages inherent to the system:

On the one hand, the use of a travelling-wave tube as a power amplifier limits the pulse duty factor, i.e. the relation between the pulse length and the pulse interval, to a relatively small value of, for example, 1%. Accordingly, when travelling-wave tubes are used, only relatively short "pulses" (correctly: bursts) can be produced, and one always has to observe a minimum interval between two successive pulses in pulse sequences. This is due on the one hand to the switching times obtained with travelling-wave amplifiers and, on the other hand, to the fact that when carrying out pulse experiments one normally wishes to be free to set the phase of successive pulses at desire, and the phaseswitching elements normally used also require a certain switching time.

The second essential disadvantage of the known singlechannel design lies in the fact that it is unsuited for continuous-wave experiments with low microwave power because in this latter case the inherent noise of the travellingwave tube would make itself felt as very disturbing. Due to these drawbacks, the application of the known arrangement is restricted in numerous ways.

Now, it is the object of the present invention to improve a spectrometer of the type described above in such a manner that it permits the selective running of continuous-wave experiments, pulse experiments or of combinations of these types of experiments, with pulse sequences in which individual pulses may follow each other even without any dead time, in the extreme case.

This object is achieved by the solution provided by the invention according to which the spectrometer comprises a first channel for supplying a continuous-wave signal or an intermittent signal of small power in the mW range and a second channel for supplying an intermittent signal of high power in the W range, and in which the channels are connected by their inputs to a common microwave source and united at their outputs so that the channels can be selectively operated either individually or jointly.

This solves the object underlying the invention fully and perfectly because now two absolutely independent channels are available for small power on the one hand and high power on the other hand, with each of these channels contributing its particular advantages to the experiment to be carried out, while their inherent drawbacks are limited to their respective very own application so that they cannot disturb the experiment.

So, it is possible for example to carry out usual continuous-wave experiments with low microwave power and high signal-to-noise ratio using the spectrometer according to the invention, with the second channel switched off, without such experiments being disturbed by the noise of the travelling-wave tube as the latter is a part of the second, switched-off channel. Also, it is possible to carry out experiments with intermittent signals of low power (with so-called "soft pulses"), and this either with or without an additional basic continuous-wave signal.

If on the other hand, in the reverse case, the first channel is switched off and the second channel is switched on, pure pulse experiments can be carried out with high microwave power, and the inherent noise of the travelling-wave tube does not make itself felt in a disturbing manner because it is not noticeable due to the high microwave power employed in these experiments.

Finally, when both channels are switched on, it is also possible to carry out experiments where the sample is subjected simultaneously to microwave energy of low power, in continuous-wave or pulse operation, and additionally to microwave energy of high power in pulse operation. In this case, the microwave pulses of small and high power are set independently of each other as regards their duty cycle, length and phase, so that the two pulses may be spaced relative to each other at desire and may be irradiated either independently of each other in time, or in immediate succession, without any dead time between the pulses, or so that they overlap each other in time fully or partly, in defined relationship.

In addition, it is possible in this or in any other of the before-described cases where microwave pulses of low power are used, to select pulse programs with arbitrary pulse duty factors because there do not exist any limitations regarding the pulse duty factor for the low-power microwave channels. The following are two typical applications for such combined experiments:

On the one hand, a short microwave pulse of high power may be used to achieve wide-band excitation of a spin package, while on the other hand electric saturation of a very narrow range of the spin package can be achieved by a microwave pulse of small power but long duration because, as is generally known, the spectral width of the frequencies produced is inversely proportional to the pulse length.

Another application consists in so-called "saturation recovery" experiments in which initially spins of one measuring sample are saturated by microwave pulses of high power and the physical recovery of the saturation is then observed with the aid of a continuous-wave signal of low power (so-called "observation power").

In order to achieve all these advantages, the first channel of the spectrometer is preferably provided with means for setting the amplitude and phase of the microwave signal, and the first signal comprises a microwave switch that can be switched at selected times by means of a control input. Preferably, the second channel is further equipped with a travelling-wave amplifier in order to make available the high microwave powers.

According to a preferred improvement of the invention, the second channel is provided with a pulse-shaping stage having a plurality of parallel pulse-shaping channels, each of them being provided with individually controllable means for setting the amplitude and phase and for switching the microwave signal.

This feature provides the advantage that it offers the possibility to select a pulse sequence for the second signal where the individual pulses can be adjusted absolutely independently of each other, as regards their point in time, magnitude and phase. Accordingly, no dead times are encountered between the pulses due to switching times of the microwave switches or switching times of the phase switches since the pulses of several parallel pulse-shaping channels are combined to a pulse, sequence, independently of each other.

Other advantages of the invention will become apparent from the following specification and the drawing. It goes without saying that the features that have been described above and will be explained hereafter can be used not only in the described combinations, but also in any other combination or individually, without leaving the scope of the present invention.

Certain embodiments of the invention will be described hereafter in greater detail with reference to the drawing in which.

Figure 1:
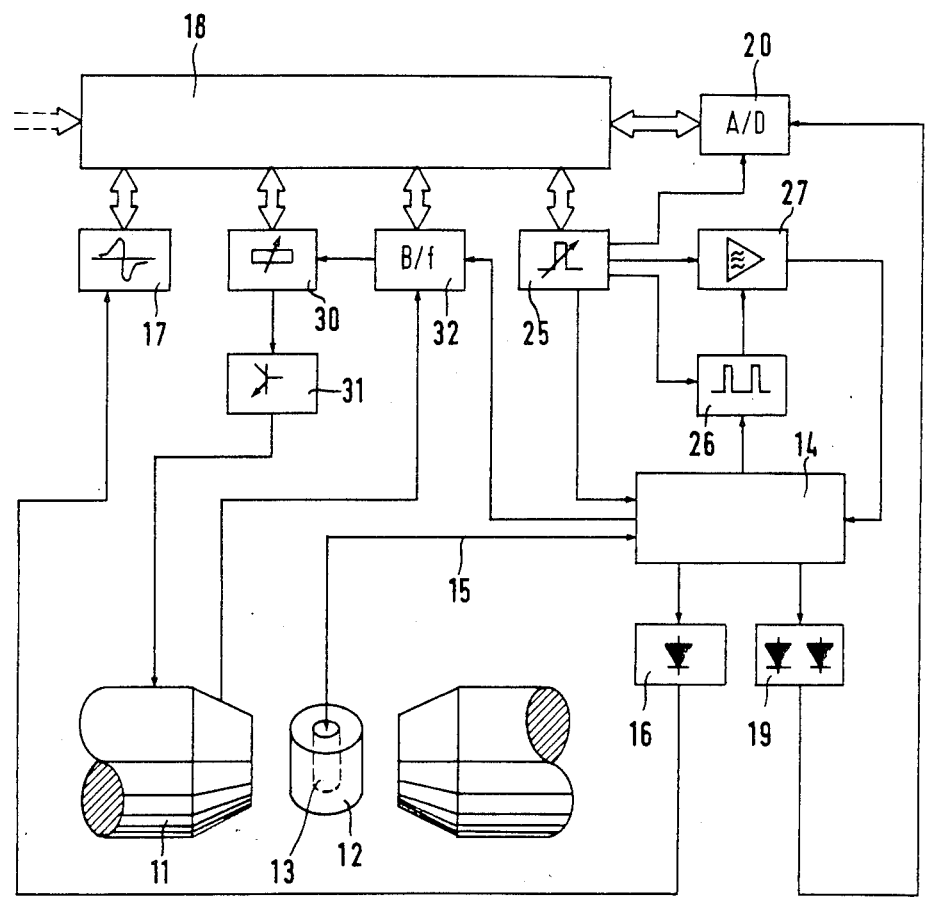
FIG. 1 shows a largely simplified block diagram of an electron spin resonance pulse spectrometer.

In FIG. 1, reference numeral 10 indicates, generally, an electron spin resonance pulse spectrometer of conventional basic configuration. Between the poles of an electromagnet 11 of high homogeneity, there is arranged a microwave resonator 12 within which the sample 13 to be examined is exposed to the magnetic field components of the microwave field and, simultaneously, to the constant magnetic field of the electromagnet 11. A microwave bridge 14 is connected to the resonator 12 via a microwave line 15 for the purpose of transmitting exciting microwave energy to the resonator 12 and, on the other hand, for receiving and processing the signals reflected by the resonator 12. Alternatively, processing of the signals may be effected by a conventional detector 16 connected to a signal amplifier 17. The signal amplifier 17 and numerous other components of the spectrometer 10 are connected to a central computer control unit 18 via a data line. On the other hand, the signal may be evaluated also via a quadrature detector 19 connected to an analog-to-digital converter with sample-and-hold stage, which in turn is connected again to the computer control unit 18 via a data line.

In order to enable the spectrometer 10 to be operated in the microwave pulse mode, a pulse program control 25 is provided which is connected to the computer control unit 18 via a data line and which controls the microwave bridge 14, the analog-to-digital converter 20 and a pulse-shaping stage 26 arranged between the microwave bridge 14 and a travelling-wave amplifier 27. The travelling-wave amplifier 27 also receives control signals from the pulse program control 25. The output of the travelling-wave amplifier 27 in turn feeds the microwave bridge 14 for transmitting microwave high-power energy to the resonator 12.

In addition, the spectrometer 10 is provided in the usual manner with a field rheostat 30 controlling a magnet power pack 31 of the electromagnet 11. A field/frequency lock 32 receives a field-dependent signal and a signal dependent on the microwave frequency, which are used by it to control the field rheostat 30 in the conventional manner. It is, thus, possible to supply microwave pulses to the resonator 12 and/or the sample 13 arranged therein, by suitable adjustment of the pulse program control 25. In this context, the term "pulses" is used to describe a wavetrain limited in time, i.e. a burst, which can be adjusted as regards the moment of its inset, its phase and amplitude. For detecting the signals received, auxiliary signals are required in a corresponding manner from the pulse program control 25 to enable the signals received to be detected and evaluated in synchronism with the high-power microwave pulses.

Figure 2:
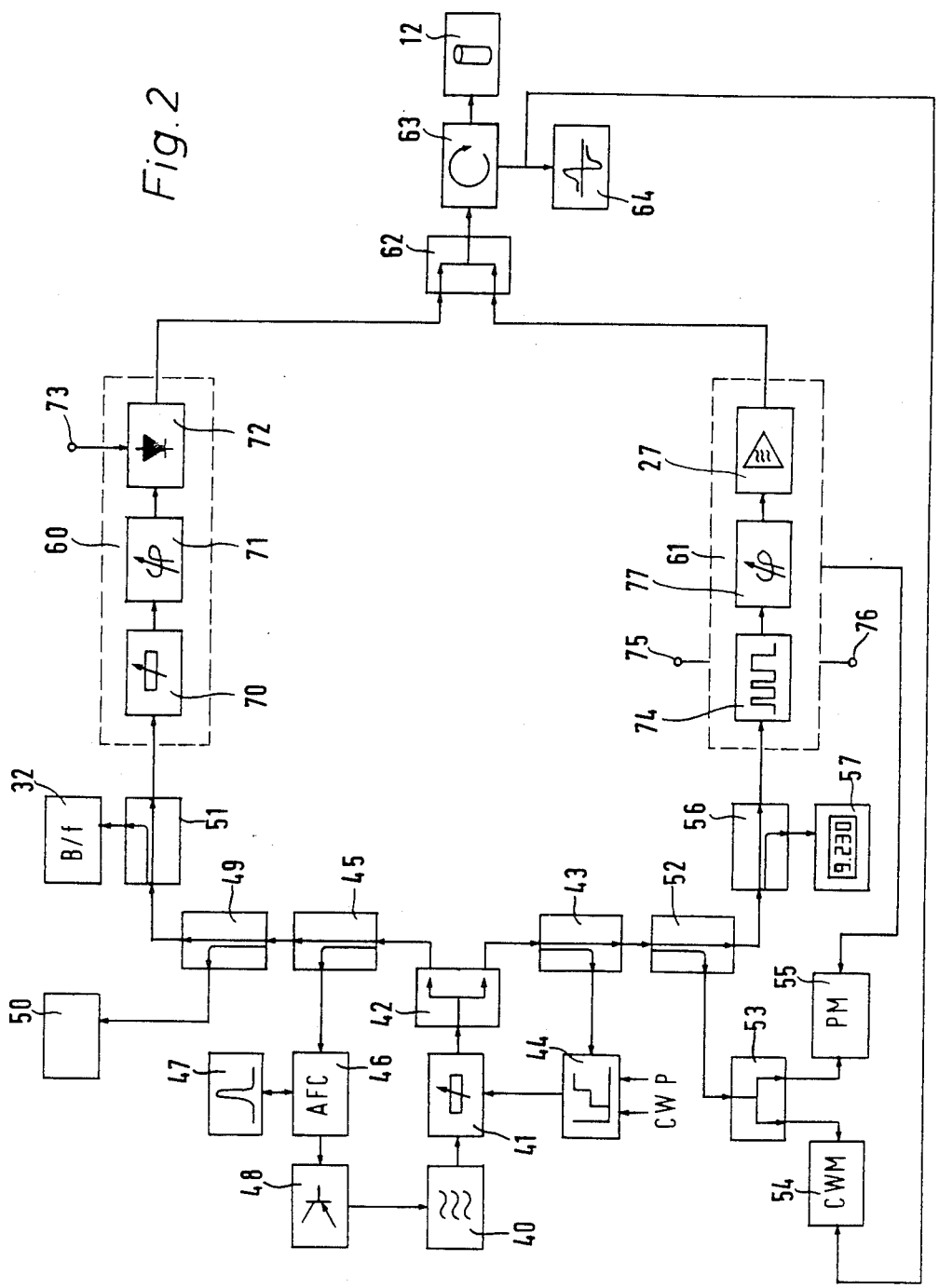
FIG. 2 shows a simplified block diagram of the microwave components of the spectrometer according to FIG. 1.

FIG. 2 shows the essential microwave components of the spectrometer 10.

A klystron 40 or another suitable microwave source is connected, via an electronically adjustable attenuator 41, to a first divider 42 which divides the microwave energy into two channels. The first output of the first divider 42 is connected to a first coupling capacitor 43 whose coupling output leads to a level control 44 which in turn controls the attenuator 41. Two input signals for continuous-wave operation (CW) and pulse operation (P) enable two steps of the attenuator 41 to be set. The illustrated arrangement permits the level of the klystron 40 to be controlled; in a typical application, a klystron having a maximum power output of 1.2 Watts in the X-band is employed whose power output is set to 200 mW in continuous-wave operation (CW) and to 800 MW in pulse operation (P).

The other output of the first divider 42 leads to a second coupling capacitor 45 whose coupling output is connected to a frequency controller 46 (ASC). The frequency controller 46 coacts with an external resonator 47 of high quality and influences by its output a power pack 48 of the klystron 40. The use of an external resonator 47 of high quality for controlling the frequency of the klystron 40 is advisable because resonators 12 of low quality, for example dielectric resonators, are required for electron spin resonance pulse experiments since a large band width of the resonator 12 is required for pulse operation. Given the very low quality of the measuring resonator 12, the latter is not suited for frequency regulation, for example for compensating possible temperature drift phenomena. One therefore uses the external resonator 47 having a quality of several thousands.

The output of the second coupling capacitor 49 leads to a third coupling capacitor 49 whose coupling output is connected to a reference branch 50 which will be described in greater detail further below, in connection with FIG. 11.

The output of the third coupling capacitor 49 leads to a fourth coupling capacitor 51 whose coupling output is connected to the field/frequency lock 32.

Regarding now the other side of the microwave circuit, the output of the first coupling capacitor 43 is connected to a fifth coupling capacitor 52 whose coupling output leads to a second divider 53. The second divider 53 feeds two monitors 54 and 55 for continuous-wave operation (CW) and pulse operation (P). The monitors 54, 55 are provided with second inputs which are supplied with microwave signals received from the signal branch and the high-power microwave branch, respectively. The monitors 54, 55 serve to check the correct setting of the microwave components, in particular the setting of the microwave pulses.

The coupling output of a sixth coupling capacitor 56 connected to the output of the fifth coupling capacitor 52 leads to a microwave counter 57. It is ensured in this manner that the microwave frequency adjusted at any time is indicated continuously. After various signals have been coupled out for measuring and control purposes the manner just described, via the coupling capacitors 43, 45, 49, 51, 52 and 56, the two microwave channels defined by the first divider 42 lead to a continuous-wave channel 60 in the upper half of FIG. 2 and a pulse channel 61 in the lower half of FIG. 2, respectively. The outputs of the channels 60, 61 are united again in a first combiner 62 and supplied to a first circulator 63 of the microwave bridge 14 whose first subsequent output leads to the resonator 12, while its second subsequent output leads to a signal processing unit indicated at 64 in FIG. 2, which will be described further below in connection with FIG. 11.

The continuous-wave channel 60 comprises substantially a series connection of a first attenuator 70, a first phase shifter 71 and a first switching diode (PIN diode) 72 that can be switched via a control input 73.

In contrast, the pulse channel 61 - which will be described in greater detail further below in connection with FIG. 5 - comprises substantially a series connection of a pulse-shaping stage 74 with control inputs 75 and 76, a second phase shifter 77 and a travelling-wave amplifier 27.

Due to the parallel arrangement of the continuous-wave channel 60 and the pulse channel 61, and the fact that their output ends are united in the first combiner 62, it is now possible to operate the system alternatively in continuouswave operation or in pulse operation; or else both operating modes may be set simultaneously for carrying out certain experiments.

In the typical application, the continuous-wave channel is sized to be capable of supplying a power output of approximately 50 mW to the resonator 12. The first switching diode 72, which typically has a rise time of 1 ns, provides the possibility either to operate the system in the continuous-wave mode (when the first switching diode 72 is in the open position) or to supply microwave pulses of low output power to the resonator 12, by actuating the first switching diode 72.

These so-called "soft pulses" may have a considerably greater pulse length than the high-power pulses received from the pulse channel 61, the length in time of the latter being determined by the admissible maximum pulse duty factor of the travelling-wave amplifier 27 which is normally in the range of 1% for the usual amplifiers of this type. By setting the first phase shifter 21 in the continuous-wave channel 60 in a suitable manner, the soft pulses may be adjusted to any phase position between 0° and 360° relative to the high-power pulses of the pulse channel 61.

The arrangement described above allows on the one hand to operate the system in the usual low-power continuous-wave mode, by switching off the pulse channel 61 and holding the first switching diode 62 permanently open.

In a second operating mode, the system can be operated exclusively with low-power microwave pulses, by switching off the pulse channel 61 and actuating the first switching diode 72.

In a third operating mode, the system can be operated in the high-power pulse mode, by switching off the continuous-wave channel 60 and actuating the pulse-shaping stage 74.

In a fourth operating mode, both channels 60 and 61 may be switched on in parallel, in which case the continuous-wave channel 60 supplies low-power pulses while the pulse channel 61 supplied high-power pulses. An example of this latter operating mode is illustrated in FIG. 3 where a first pulse 80 of low power but great length is followed, as a function of time, by a second pulse 81 of high power but little length.

It is generally known that, due to the dependence of the time domain on the frequency domain, and as a result of the Fourier transform, the pulse width is inversely proportional to the spectral width of the frequency distribution in the frequency range. Consequently, a short pulse in the time domain leads to a very broad frequency distribution, while a long pulse leads to a very narrow frequency distribution. This phenomenon can be utilized for the experiment according to FIG. 3 so that one obtains a frequency distribution as shown in FIG. 4, where a relatively broad frequency distribution 82 caused by the second pulse 81 exhibits a very narrow incision originating from the first pulse 80. Accordingly, it is possible by means of the soft pulse 80 to achieve selective saturation (incision 83) in an otherwise broad spin package (frequency distribution 82).

Figure 3:
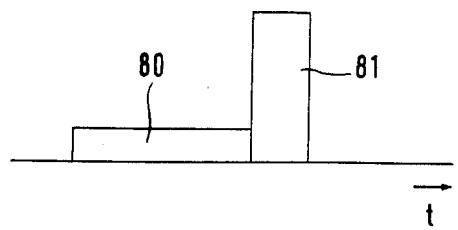
FIG. 3 shows the development in time of two microwave pulses, illustrating the parallel application of microwave circuits of low and high power.
Figure 4:
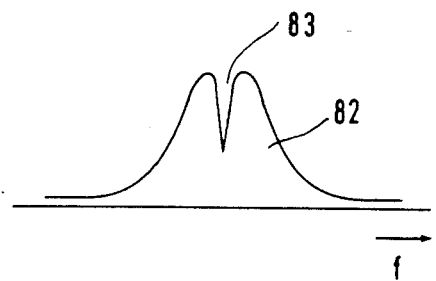
FIG. 4 shows the spectral distribution of microwave energy when the technique illustrated in FIG. 3 is applied.

It goes without saying that the representation of FIG. 3, with the pulses 80 and 81, is to be understood as an example only; the pulses may of course have any desired time relationship, phase position or amplitude relationship, or may, for example, even coincide. Finally, a fifth operating mode is possible where the pulse channel 61 supplies the high-power pulses described before, while the continuous-wave channel 60 operates in the continuous-wave mode because the first switching diode 72 is held permanently open. This admixture of a continuous-wave level of the high-power pulses may be employed to produce the so-called "saturation recovery" which comprises the steps of saturating the spin system and detecting thereafter the recovery of the system from the saturated condition by means of the continuous-wave level.

In this case, the parallel use of a separate low-power continuous-wave channel 60 provides the advantage that very low continuous-wave levels can be used without the noise of the travelling-wave amplifier making itself felt in a disturbing manner, which would be the case if only a single high-capacity channel were used and the latter were to be changed over to low-level continuous-wave operation after irradiation of the high-power pulses.

Figure 5:
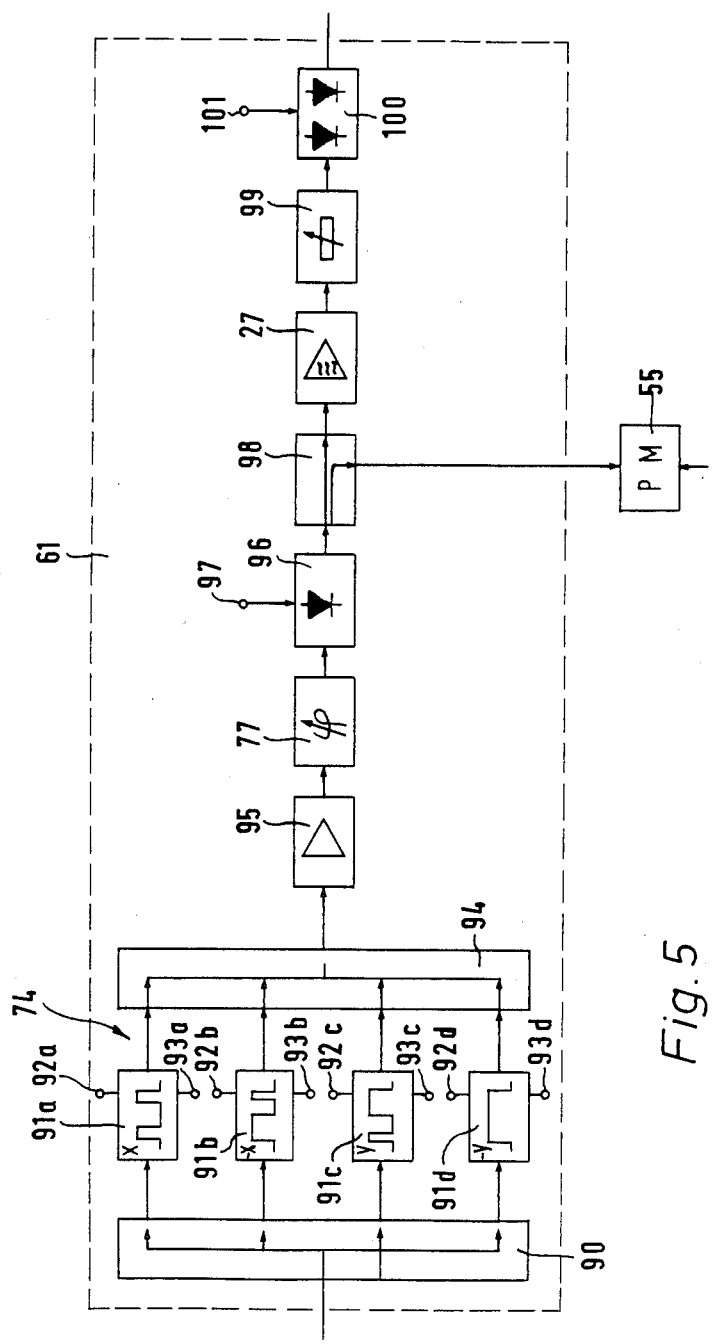
FIG. 5 shows another block diagram illustrating details of a high-power microwave channel of the block diagram shown in FIG. 2.

FIG. 5 shows certain other details of the pulse channel 61.

At the input end of the pulse channel 61, one can see a third divider 90 which acts to divide the incoming microwave energy into four parallel and equivalent pulse-shaping channels 91a, 91b, 91c and 91d which at the output end are united again by a second combiner 94 which is symmetrical to the third divider 90. Each of the pulse-shaping channels 91a to 91d comprises two control inputs 92a to 92d or 93a to 93d, respectively, which will be explained in greater detail further below in connection with FIGS. 6 and 8.

The output of the second combiner 94 is followed by a series connection comprising a preliminary microwave amplifier 95, the second phase shifter 77, a second switching diode 96 with control input 97, a seventh coupling capacitor 98 whose coupling output leads to the pulse monitor 55, the travelling-wave amplifier 27, a second attenuator 99 and a switching stage 100 with control input 101.

The four parallel pulse-shaping channels 91a to 9d enable arbitrary pulse programs to be compiled. For example, it is possible to set a so-called X pulse (0° phase) in the first pulse-shaping channel 91a, a so-called −X pulse (+90° phase) in the second pulse-shaping channel 91b, a so-called Y pulse (+180° phase) in the third pulse-shaping channel and, finally, a so-called −Y pulse (+270° phase) in the fourth pulse-shaping channel 91d.

The parallel arrangement of four pulse-shaping channels 91a to 91d provides the advantage that the before-mentioned X, −X, Y and −Y pulses can be set to any phase position relative to each other. This would not be possible within one and the same channel because the usual components used for switching the phase of microwave signals exhibit a switching time considerably longer than 3 ns so that very close phase relations cannot be realized in this manner. In contrast, the use of parallel channel makes it possible to set very close phase positions, including the phase position 0.

As will be described further below in connection with FIGS. 6 and 8, the pulse-shaping channels 91a to 91d are already provided with switching diodes for attenuating the microwave power. The second switching diode 96 with control input 97, following the common output of the second combiner 94, serves in addition the purpose to enlarge the dynamic range because the travelling-wave amplifier 27 exhibits, for example, a dynamic range of 53 dB which cannot be spanned by a single switching diode. For attenuating and, thus, utilizing the whole dynamic range of the travelling-wave amplifier 27, one therefore uses two such switching diodes connected in series, because usual switching diodes exhibit a dynamic range of approximately 25 dB.

The second attenuator 99, which may be designed as a highpower attenuated with a range of, say, 0 to 60 dB, is arranged in the output of the travelling-wave amplifier 27.

Figure 10:
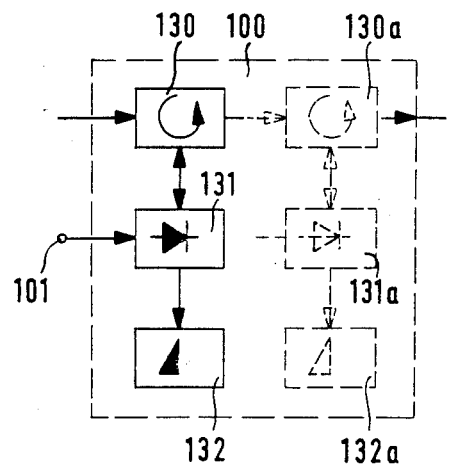
FIG. 10 shows a block diagram illustrating other details of a switching stage as shown in FIG. 5.

As is generally known, it is a particularity of usual travelling-wave amplifiers that when a microwave pulse is amplified, a so-called "tail", i.e. a decay process, appears at the end of the trailing edge. This phenomenon makes itself felt in a very disturbing manner in electron spin resonance pulse experiments. One therefore provides the switching stage 100 which serves the function to cut off this pulse "tail". This reduces the dead time of the spectrometer considerably. The details of the switching stage 100 are illustrated in FIG. 10 and described in the relevant part of the specification.

Figure 6:
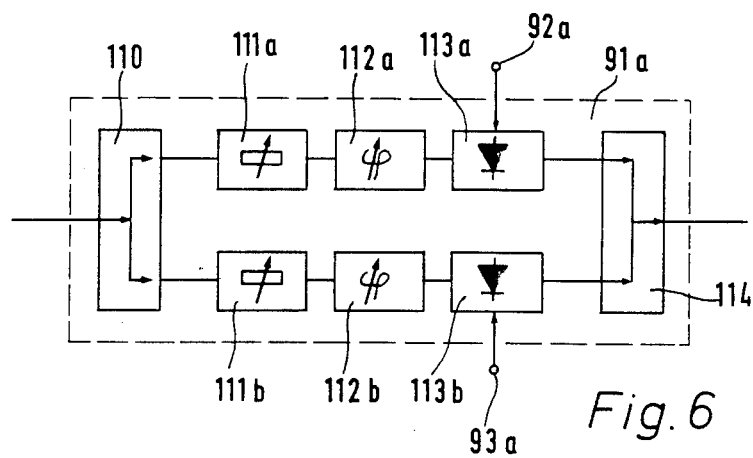
FIG. 6 shows a block diagram of other details of pulseshaping channels of the block diagram shown in FIG. 5.

FIG. 6 shows a first variant of an embodiment of a pulse-shaping channel 91a.

As can be clearly seen in FIG. 6, here again two parallel branches are provided which are formed by a fourth divider 110 arranged in the input. Each branch comprises a series connection of a third attenuator 111a or 111a, a third phase shifter 112a or 112b, a third switching diode 113a or 113b associated with the before-mentioned control inputs 92a and 93a, and the branches are finally united again in a third combiner 114.

The upper branch 111a . . . in FIG. 6 serves as a so-called "master" branch and generates the desired pulse, for example an X pulse by operation of the third switching diode 113a when the control input 92a is triggered.

Figure 7:
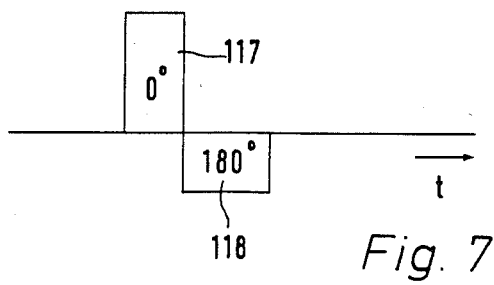
FIG. 7 illustrates the dependence of time of microwave pulses of the type that can be produced with the aid of a pulse-shaping channel according to FIG. 6.

Due to the fact that in spite of its relatively low quality the measuring resonator 12 still exhibits a limited band width only, a decay process described as "ringing" occurs when a high-power microwave pulse is supplied to the resonator. In order to eliminate this disturbing effect, the lower branch 111b . . . in FIG. 6 is intended to serve as a "slave" branch in which a suppression pulse shifted by 180° relative to the "master" pulse is generated. A pulse sequence of this type is shown in FIG. 7. Reference numeral 117 designates the so-called "physical pulse" serving to carry out the electron spin resonance experiment proper, i.e. for exciting the sample 13. The "physical pulse" 17 which exhibits, for example, the 0° phase (X pulse) is followed by a so-called "technical pulse" 118 exhibiting a phase position of 180° for suppressing the decay process of the resonator 12 (cavity-ringing quenching pulse).

It is apparent that for reasons of high-frequency technology, the distance between the pulses 117, 118 should possibly be equal to 0. For practical reasons it may, however, be advantageous to provide a small time interval between the pulses 117, 118, which is achieved by means of the monitors 54 and 55.

Preferably, the elements of the "master" branch 111a . . . and of the "slave" branch 111b . . . are designed identically. As can be seen in FIG. 6, both the phase and the amplitude of the pulse (or of the pulse sequence) can be adjusted separately in each branch. Typically, one will use an amplitude adjusting range of 0 to 30 dB and a phase adjusting range of 0 to 360°, with a resolution of 0.1°.

If one regards FIG. 6 in conjunction with FIG. 5, it appears that the four double-branched pulse-shaping channels 91a to 91d provide a total of eight, for example identical, microwave channels. This permits the pulse channel 61 to be operated in different operating modes:

In one operating mode, arbitrarily selected pulse sequences can be adjusted by means of the four pulse-shaping channels 91a to 91d, and the decay process of the resonator 12 can be suppressed in each case. It is possible in this manner to subject the sample 13 to pulses or pulse sequences of the type known from the magnetic resonance technique. The pulse sequences of Carr-Purcell or Carr-Purcell-Meiboom-Gill may serve as examples in this connection. Even experiments with so-called phase rotation are possible. The technical differences in the two branches of the quadrature detectors 19, which will be described in greater detail further below in connection with FIG. 11, and in the associated video amplifiers can be averaged out by exchanging the phases cyclically and sorting the resulting data in a corresponding manner.

If one designates a measured absorbtion signal by A, and a measured dispersion signal by D, and if X and Y pulses are employed and the phases are cyclically exchanged, one obtains at the output of the double video amplifiers at first signals A, D, then signals D, A, then signals −A, −D and finally signals −D, −A. By adding, subtracting or dividing these signals in a suitable manner it is then possible to eliminate any constant errors.

In this connection, it is of particular advantage that the two branches in each pulse-shaping channel 91a to 91d allow extremely short dead times because each physical pulse (117 in FIG. 7) is followed by a technical quenching pulse (118 in FIG. 7).

The following is another operating mode which is rendered possible by the totally eigth microwave channels:

In cases where it is desired to subject the sample 13 to very selective, i.e. narrow-band excitation, the shape of the microwave pulse should assume the form of a Gaussian curve in the time domain. Such a distribution curve can be synthesized easily with the aid of eight microwave channels, by causing all the eight channels to supply simultaneously a specific amplitude each. Considering that each of the eight channels can be adjusted individually as regards its amplitude and that all the eight channels are mixed at the output by the second and third combiners 94, 114, it is possible in this way to achieve an amplitude resolution of $2^8$, i.e. of 1:256.

Figure 8:
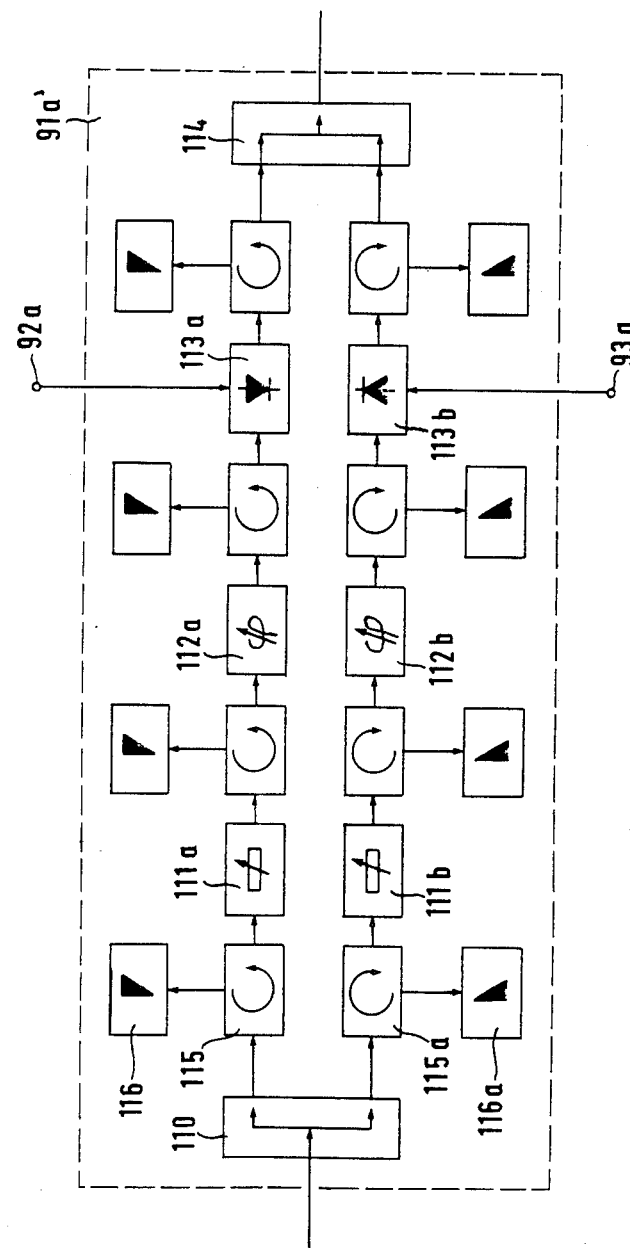
FIG. 8 shows a block diagram of a variant of the embodiment shown in FIG. 6.

FIG. 8 shows the result of this experiment carried out with a pulse shape 120 of Gaussian distribution composed of individual pulses 121, which are generated in succession. As mentioned before, the amplitude resolution 122 achievable is 1:256.

Figure 9:
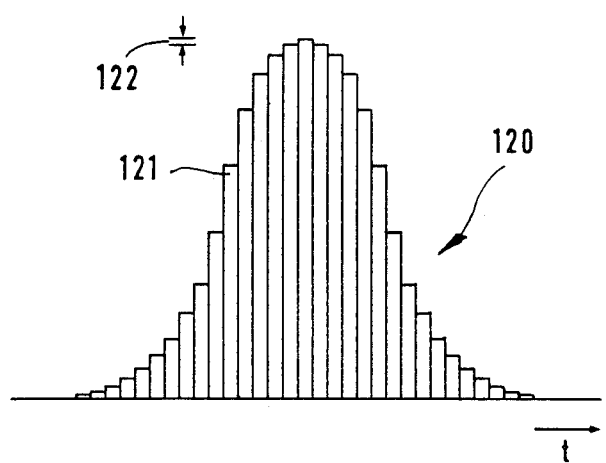
FIG. 9 illustrates the dependence of time of successive microwave pulses of the type which can be used for synthesizing pre-determined distribution curves and which can be generated with the aid of the pulse-shaping channels of FIGS. 6 and 8.

FIG. 9 shows a variant of a pulse-shaping channel 91a' which differs from the embodiment of FIG. 6 by the fact that circulators 115 or 115a which have their third outputs connected each to a waveguide termination 116 or 116a, respectively, are provided between the elements 110, 111a, 112a, 113a, 114 and 110, 111b, 112b, 113b, 114 shown in FIG. 6. The circulators 115 used at the output of the fourth divider 110 and at the input of the third combiner 114 may consist of duplex insulators with a backward attenuation of 40 dB, while the remaining circulators may consist of single insulators with a backward attenuation of 25 dB.

By providing the additional circulators 115 and 115a, the absence of interaction in the system is improved and the before-mentioned eight channels are decoupled from each other.

FIG. 10 shows additional details of the switching stage 100 represented in FIG. 5 at the output of pulse channel 61.

It is of course possible to use a simple switching diode for switching and/or attenuating the microwave power, which is in fact the case with the second switching diode 96 in the pulse channel 61. However, where large microwave powers have to be switched, this may lead to problems because the very high microwave power applied may cause the diode to be connected through automatically, due to an avalanche effect.

Problems of this type can be avoided by the use of a switching stage 100 as represented in FIG. 10. Instead of connecting a switching diode into the microwave branch, a third circulator 130 is employed whose second connection is connected to a fourth switching diode 31 which in turn leads to a second waveguide termination 132. The fourth switching diode 131 may be switched to a conductive and a nonconductive state via the control input 101.

As can be further seen in FIG. 10, the elements 130, 131 and 132 may be provided also in cascade arrangement, by connecting a desired number of additional element sets 130a, 131a, 132a in series.

As mentioned already with reference to FIG. 5, the switching stage 10 serves the purpose to cut off the high-power output pulse of the travelling-wave amplifier 27 in order to prevent this pulse "tail" from disturbing the electron spin resonance experiments. This is achieved by triggering the control input 101 in time-synchronism with, or with a slight delay after the trailing edge of the microwave pulse. The fourth switching diode 131 is initially in the blocked condition so that the high-power microwave pulse can be guided across the circulator 130 because the blocked switching diode 131 reflects the microwave pulse without getting itself in the avalanche area. It has of course to be taken into consideration in this connection that the insertion loss of the fourth switching diode 131 must be sized suitably to ensure that the switching diode is not switched to the conductive state when reflecting the high-power microwave pulse.

The trailing edge of the microwave pulse now sets the fourth switching diode 131 to the conductive state so that the pulse "tail" is guided in the circulator 130 via the fourth switching diode 131 into the waveguide termination 132. If switching-through of the fourth switching diode 131 is delayed a little relative to the trailing edge of the microwave pulse, one may take advantage of the fact that the output pulse of the travelling-wave amplifier 27 has lost approx. 30 to 40 dB already after a very short period of time so that the fourth switching diode 131 has to switch through only the level remaining after this loss of 30 to 40 dB. This switching behavior will be sufficient for most electron spin resonance experiments because the steepness of the trailing edge is sufficiently great during the short period of time between the trailing edge of the microwave pulse and switching-on of the fourth switching diode 131.

This cutting of the pulse "tail" may of course be improved further by the cascade arrangement of the elements indicated in FIG. 10.

Figure 11:
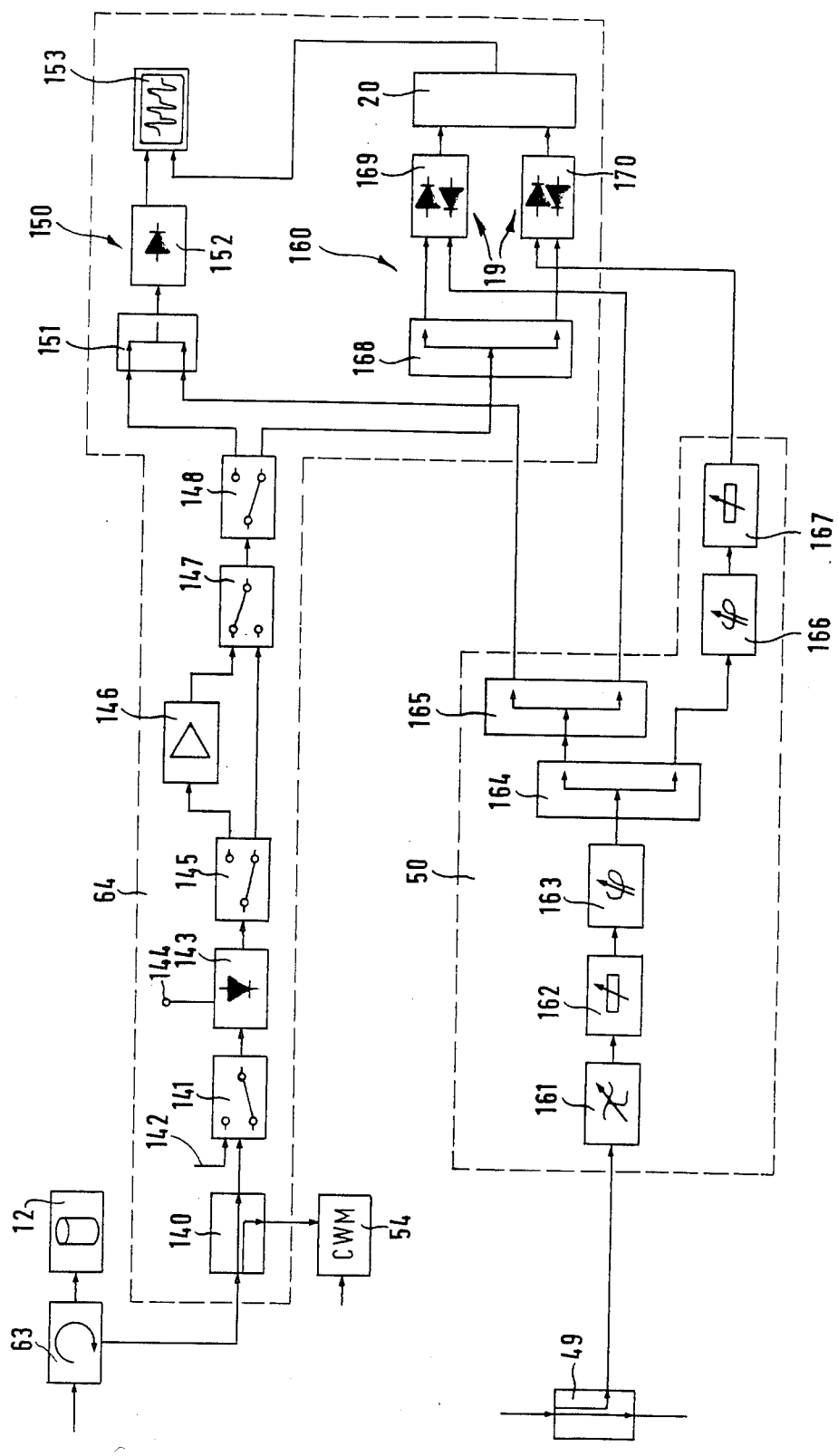
FIG. 11 shows a block diagram illustrating the signal evaluating circuits of the electron spin resonance pulse spectrometer of FIG. 1.

FIG. 11 finally shows additional details of the signal-processing arrangement.

The measuring signal reflected by the resonator 12, which contains the information on the electron spin resonance experiment to be recorded, can be picked up in the usual manner at the third connection of the circulator 63. It is supplied initially to an eighth coupling capacitor 140 from which a coupling output leads to the monitor 54 of the continuous-wave channel. The output of the eighth coupling capacitor 114 is initially connected to one input of a first change-over switch 141 whose second input is available for connection of another resonator, for example an induction resonator.

The output of the first change-over switch 141 is connected to a fifth switching diode 143 with control input 144 which in turn leads to a second change-over switch 145. In the one position of the second change-over switc 145, the measuring signal is passed on unchanged, while in another switch position a preliminary microwave amplifier 146 is switched on which in a typical application exhibits an amplification of 38 dB, with a noise factor of only 1.9 dB. In order to protect the preliminary microwave amplifier 146 in this operating mode from high-power pulses, the fifth switching diode 143 is provided which is in the open state only during the pulse intervals, in order to supply the free induction loss of the electron spin resonance signal to the preliminary microwave amplifier 146 during the pulse intervals, while during the rest of the time it protects the latter against the high-power pulses.

A third change-over switch 147 unites the before-described branches again and feeds a fourth change-over switch 148 whose upper switching position—viewed in FIG. 11—is used for continuous-wave measurements, while its lower switching position is preferably used for pulse measurements. In the upper switching position of the fourth change-over switch 148, a continuous-wave channel 150 comprising a fourth combiner 151, a single-phase detector 52, for example a coaxial Schottky-Barrier diode, is activated which amplifies the total signal formed from the measuring signal (arriving from the fourth change-over switch 148) and the reference signal (supplied via the second input of the fourth combiner 151) with a band width of, for example, 30 Hz to 5 MHz, and processes it thereafter in the usual manner. Finally, the electron spin resonance signal is displayed by an indication unit 153, for example a display, a printer, or the like. In addition, it may be stored, evaluated or processed in any other manner as known in the art. In the lower switching position of the fourth change-over switch 148, the measuring channel shown in the lower half of FIG. 11 and comprising the reference branch 50 and a subsequent quadrature channel 160, is activated.

In the reference branch 50, the microwave reference signal coupled out by the third coupling capacitor 49 reaches at first the series connection composed of a delay element 161, a fourth attenuator 162 and a fourth phase shifter 163, before it is split up in a fifth divider 164. A first output of the fifth divider 164 leads to the input of a sixth divider 165 whose one output supplies the reference signal for the fourth combiner 151 which has been described above in connection with the continuous-wave channel 150. The second output of the fifth divider 164 leads to the quadrature channel 160, via the series connection consisting of a fifth phase shifter 166 and a fifth attenuator 167.

A sixth divider 168 provided in this quadrature channel 160, on its input end, has its input connected to the fourth change-over switch 148. The two outputs of the sixth divider 168 lead to a first quadrature detector 169 and a second quadrature detector 170, respectively, designated in FIG. 1 by the common reference numeral 19. The second input of the first quadrature detector 169 is connected to the second output of the sixth divider 165, while the second input of the second quadrature detector 170 is connected to the output of the fifth attenuator 167. The outputs of the quadrature detectors 169, 170 are finally connected to the analogue-to-digital converter 20 with sample-and-hold stage, and this unit is in turn connected to the display unit 153, via additional elements of a conventional type which are not shown in detail in FIG. 11. During pulse operation, the so-called "FID"—free induction decay—is measured in two orthogonal projections of the circulating magnetization.

As results from the above, the quadrature detectors 169 and 170 are supplied on the one hand—via the sixth divider 168 —with the measuring signal and, on the other hand, with a reference signal, which latter can be adjusted in the second quadrature detector 170 by means of the elements 166, 167, as regards its amplitude and magnitude relative to the other reference signal at the lower output of the sixth divider 165.

For normal spin echo experiments it will of course be sufficient to use only one quadrature detector 169 or 170, in which case the other branch is switched off. The quadrature detectors 169, 170 used consist of microwave mixers with a high dynamic ratio.

The block 20 shown in FIG. 11 contains firstly a two-channel video amplifier having a band width of 50 MHz to 200 MHz and an amplification of, for example, 66 dB. The output signals of this video amplifier are then supplied to an analogue-to-digital converter and from there to the computer control unit 18. For the sake of clarity, all these details are not shown separately in FIG. 11.

Generally, commercially available microwave and highfrequency components of the type usual and known in electron spin resonance spectrometry may be employed for the described components of the spectrometer 10.

We claim:

1. An electron spin resonance spectrometer comprising:
    an electromagnet for generating a magnetic field of constant strength and high homogeneity over a predetermined space;
    a microwave resonator arranged in said space and receiving a sample under investigation;
    a microwave generator for generating a continuous wave microwave signal and for supplying microwave energy to a microwave bridge, said microwave bridge being connected to said resonator to supply microwave energy to said resonator and being, further, connected to signal detection means for receiving and processing signals emitted from said resonator;
    a microwave divider having a first and a second output for dividing said microwave continuous wave signal from said microwave generator into two portions;
    a first low-power continuous wave channel connected to said first output of said microwave divider and comprising means for adjusting the phase and amplitude one of said microwave signal portions to provide a first output continuous wave signal in the Milliwatt-range;
    a second high-power pulse channel connected to said second output and comprising means for switching and amplifying and for adjusting phase and amplitude of the other of said microwave signal portions to provide a second an output pulse signal being in the Wattrange;
    a microwave combiner for combining said first and second output signals and for feeding said combined signals to said microwave bridge;
    means for operating said low-power continuous wave channel and said high-power pulse channel either separately or jointly.

2. A spectrometer according to claim 1, wherein the said first channel comprises means for adjusting the amplitude and the phase of the microwave signal.

3. A spectrometer according to claim 1, wherein the said first channel comprises a microwave switch which can be switched at selective times by means of a control input.

4. A spectrometer according to claim 1, wherein the said second channel comprises a travelling-wave amplifier.

5. A spectrometer according to claim 1, wherein the said second channel is provided with a pulse forming stage having a plurality of parallel pulse forming channels, each of them being provided with individually controllable means for setting the amplitude and phase and for switching the microwave signal.

* * * * *

UNITED STATES PATENT AND TRADEMARK OFFICE
CERTIFICATE OF CORRECTION

PATENT NO.   : 4,782,296

DATED        : November 1, 1988

INVENTOR(S)  : Klaus-Dieter Schmalbein et al

It is certified that error appears in the above-identified patent and that said Letters Patent is hereby corrected as shown below:

On the title page assignee should read

-- Bruker Analytische Messtechnik GmbH, Silberstreifen --.

Signed and Sealed this

Sixteenth Day of January, 1990

*Attest:*

JEFFREY M. SAMUELS

*Attesting Officer*  *Acting Commissioner of Patents and Trademarks*